United States Patent
Baxter et al.

(10) Patent No.: US 8,139,337 B2
(45) Date of Patent: Mar. 20, 2012

(54) SYSTEMS AND METHODS FOR REDUCING ELECTRICALLY-CAUSED FIRES IN WIRING DEVICES

(75) Inventors: Michael Baxter, Hillsboro, OR (US); Glenn Spacht, Lloyd Neck, NY (US); Brent Baxter, Hillsboro, OR (US)

(73) Assignee: Energy Safe Technologies, Inc., Great Neck, NY (US)

( * ) Notice: Subject to any disclaimer, the term of this patent is extended or adjusted under 35 U.S.C. 154(b) by 504 days.

(21) Appl. No.: 12/236,400

(22) Filed: Sep. 23, 2008

(65) Prior Publication Data

US 2010/0073829 A1 Mar. 25, 2010

(51) Int. Cl.
H02H 3/00 (2006.01)
(52) U.S. Cl. .......................... 361/103; 361/42
(58) Field of Classification Search ............ 361/42, 361/103, 106
See application file for complete search history.

(56) References Cited

U.S. PATENT DOCUMENTS

| | | | |
|---|---|---|---|
| 3,665,252 A | 5/1972 | Rogers et al. | |
| 4,059,843 A | 11/1977 | Girismen | |
| 4,378,579 A | 3/1983 | Hudson, Jr. | |
| 4,466,040 A | 8/1984 | Barthel et al. | |
| 4,915,639 A | 4/1990 | Cohn et al. | |
| 4,970,349 A | 11/1990 | Jones | |
| 4,995,017 A | 2/1991 | Sellati et al. | |
| 5,029,037 A | 7/1991 | Bartelink | |
| 5,095,182 A | 3/1992 | Thompson | |
| 5,151,841 A | 9/1992 | Knights | |
| 5,267,116 A | 11/1993 | Avitan | |
| 5,426,552 A | 6/1995 | Avitan | |
| 5,708,551 A | 1/1998 | Bosatelli | |
| 5,999,384 A | 12/1999 | Chen et al. | |
| 6,038,115 A | 3/2000 | Kleemeir et al. | |
| 6,049,143 A | 4/2000 | Simpson et al. | |
| 6,111,733 A | 8/2000 | Neiger et al. | |
| 6,252,407 B1 | 6/2001 | Gershen | |
| 6,455,789 B1 | 9/2002 | Allison | |
| 6,552,888 B2 | 4/2003 | Weinberger | |
| 6,707,652 B2 * | 3/2004 | Engel | 361/42 |
| 6,986,674 B1 | 1/2006 | Gorman | |
| 7,400,476 B1 | 7/2008 | Hull, Jr. | |
| 7,495,876 B2 * | 2/2009 | Dunne et al. | 361/103 |
| 7,505,237 B2 | 3/2009 | Baxter | |

(Continued)

OTHER PUBLICATIONS

Hewitt, Bob, What does it do and what does it not do, GFI (Grand Fault Interpreter), 2002, http://www.misterfixit.com/gfi.htm.

(Continued)

Primary Examiner — Danny Nguyen
(74) Attorney, Agent, or Firm — Michael F. Krieger; Kirton & McConkie

(57) ABSTRACT

Systems and methods that provide improved detection of series fault conditions are described. The systems provide an increased range of response possibilities upon detection of such conditions. Solid-state temperature sensors are utilized and may be connected to a printed circuit board integrated with supply wire terminals, thus providing electronic circuitry controlling the response to over-temperature events while simultaneously keeping the temperature sensors in close proximity with the location of potential over-heating events. Electronic sensors in accordance with implementations of the present invention detect overheating conditions at temperatures more quickly because of the close proximity of the sensors to locations of potential overheating, thereby improving the safety of electrical wiring devices and fixtures. Additionally, the threshold temperature for response can more easily be selected or controlled to be at a variety of temperatures to improve safety.

18 Claims, 9 Drawing Sheets

U.S. PATENT DOCUMENTS

2002/0097546 A1* 7/2002 Weinberger .................. 361/103

OTHER PUBLICATIONS

Goldwasser, Sam, GFCI, Redwood Kordon, 1998, http://www.codecheck.com/gfci_principal.htm.

Child Safety Products Life Tips, 2006, http://childsafetyproducts.lifetips.com/cat/60344/outlet-covers/index.html.

Carecovers: Child Safety Sliding Panel Outlet Covers, Safe Home Products, Inc., 2006, http://www.safehomeproducts.com/shp2/sf/care_cover.asp.

Arc Fault Circuit Interrupter (AFCI) Fact Sheet, Nov. 2006, http://www.cpsc.gov/CPSCPUB/OUBS/afcifac8.pdf.

Consumer Product Safety Commission, Nov. 2006, http://www.cpsc.gov/CPSCPUB/OUBS/afcifac8.pdf.

Appendix 6210-T2 Extension Card Safety Commission, Jefferson Lab, Nov. 2003, http://www.jlab.org/ehs/manual/PDF/6210T2 Extension Cords.pdf.

Electrical Outlet Safety, Acme Parts.com, Inc., 2006, http://www.acmehowto.com/howto/homemaintenance/electrical/outlet-safety.php.

Electrical Outlets Safety, U.S. Consumer Product Safety Commissioner, 2004, http://electricalbobvila.com/Article/789.html.

Technical Data Sheet: National Semiconductor LM181 Ground Fault Interruptor, 8 pages, Jun. 1992 (Copyright 1995).

* cited by examiner

SYSTEMS AND METHODS FOR REDUCING ELECTRICALLY-CAUSED FIRES IN WIRING DEVICES

BACKGROUND OF THE INVENTION

1. Field of the Invention

The present invention relates to electrical fixtures and wiring devices, and more particularly to systems and methods for reducing electrically-caused fires in fixtures and wiring devices due to excessive heating at wiring connections.

2. Background and Related Art

Many building fires occur because of faults in series with a power outlet, light switch or other fixture. For example, loose connections cause points of excessive heating under normal use. If not detected, this localized heating leads to fires by igniting wire insulation, fixture materials, framing, or other nearby flammable objects. The fires caused by the excessive localized heating result in property loss, injury and even death.

These points of excessive heating are most commonly found at the wiring connection to the fixture. The excessive heating happens for one of several different reasons that include: an installer who neglects to tighten or fully tighten screws on the supply wires; regular use that loosens supply wire connections; supply wire connection materials that become oxidized; and/or an unqualified installer who connects supply wires improperly. Any of these conditions/causes leads to unexpected electrical resistance at the connection point, and electrical current flowing through the higher-than-expected electrical resistance causes the overheating and fires described above.

FIG. 1 illustrates the effect of a series fault. The left-most screw of the illustrated plug receptacle was not tightened sufficiently and overheated, melting the insulation on the supply wire. Furthermore, the screw oxidized, increasing the excessive heating and leading to melted plastic and a destructive fire.

Attempts have been made to create electrical wiring devices, such as plug receptacles and outlets, that detect heating and that discontinue electrical power draw to eliminate the overheating condition. Currently-available devices and methods rely on bimetallic thermal sensors acting as a switch to cause a disconnect in the electrical current. When the electrical current is interrupted, the power delivered to the high-resistance connection stops, along with the heating generated by the power lost at the connection. Such devices have proved difficult to implement. For example, typical bimetallic thermal sensors/switches, such as one of brass and invar, have a switching threshold of approximately 200 degrees Fahrenheit. While most plastic household wiring insulation and outlet housings do not melt until temperatures reach or exceed approximately 300 degrees Fahrenheit, operation approaching 200 degrees Fahrenheit has a high probability of causing distortion of the materials. Additionally, it is possible for heat to exceed 200 degrees Fahrenheit in one location of the device before the bimetallic switch itself is heated sufficiently to cause thermal switching. Because of the bulk of typical bimetallic switches, it is difficult to locate such switches close to the locations of potential heating, and thus such bimetallic switches fail to adequately protect against over-heating even when they have a lower temperature threshold for switching.

Some approaches have tried to address differences in heating location by using multiple bimetallic switches or using heat-conductive materials in the devices. Such attempts lead to higher manufacturing costs and also fail to address the fact that the 200-degree threshold of the bimetallic thermal switching, while preventive of fires, fails to prevent material distortion with its attendant risks and difficulties.

Current circuit breakers and fuses are unable to detect points of excessive heating, because they measure electric current rather than temperature. The electric current flowing through a point of excessive heating is typically within the range of normal current flow of circuit breakers and fuses. Arc Fault Circuit Interrupters (AFCI) are a type of circuit breaker technology that is capable of detecting parallel faults, or faults between line and neutral that are in parallel with the outlet or device. AFCI devices do not provide protection against series faults that lead to glowing connections (overheating) and subsequent fires.

BRIEF SUMMARY OF THE INVENTION

Implementation of the invention provides improved detection of series fault conditions, and provides improved response possibilities upon detection of such conditions. Some implementations of the invention utilize electronic temperature sensors such as solid-state sensors and temperature sensors integrated into an integrated circuit. In some implementations, the electronic temperature sensors are connected to a printed circuit board (PCB) that is connected to supply wire connectors, and in other implementations they are directly connected to supply wire connectors. In some implementations, differential temperature sensing, as an alternative to or in addition to direct temperature sensing, is provided.

The electronic temperature sensors can be quite small, and can therefore be located more closely to or directly on the supply wire connectors, which improves the rapidity with which localized heating can be detected. As the electronic sensors can be connected to PCBs and to other circuits, functionalities can be implemented using the PCBs and/or other circuits that cannot be provided with simple switching-type thermal sensors. Non-limiting examples of such additional functionality include integrated ground-fault detection, integrated safety features such as open-circuit, short-circuit, and ground fault detection, and integrated notification of detected fault conditions.

Electronic sensors in accordance with implementations of the present invention are capable of detecting overheating conditions at temperatures below those detected by current bimetallic temperature sensors, thereby improving the safety of electrical wiring devices and fixtures. Additionally, using electronic sensors, the threshold temperature for response can be selected or controlled to be at a variety of temperatures, including temperatures lower than those available with current bimetallic switching sensors. Detecting heating events and disconnecting power at lower temperatures improves safety. Implementations of the invention may be incorporated into any type of wired electrical device, electrical fixture, or wiring device.

BRIEF DESCRIPTION OF THE SEVERAL VIEWS OF THE DRAWINGS

The objects and features of the present invention will become more fully apparent from the following description and appended claims, taken in conjunction with the accompanying drawings. Understanding that these drawings depict only typical embodiments of the invention and are, therefore, not to be considered limiting of its scope, the invention will be described and explained with additional specificity and detail through the use of the accompanying drawings in which:

DETAILED DESCRIPTION OF THE INVENTION

Figure 1:
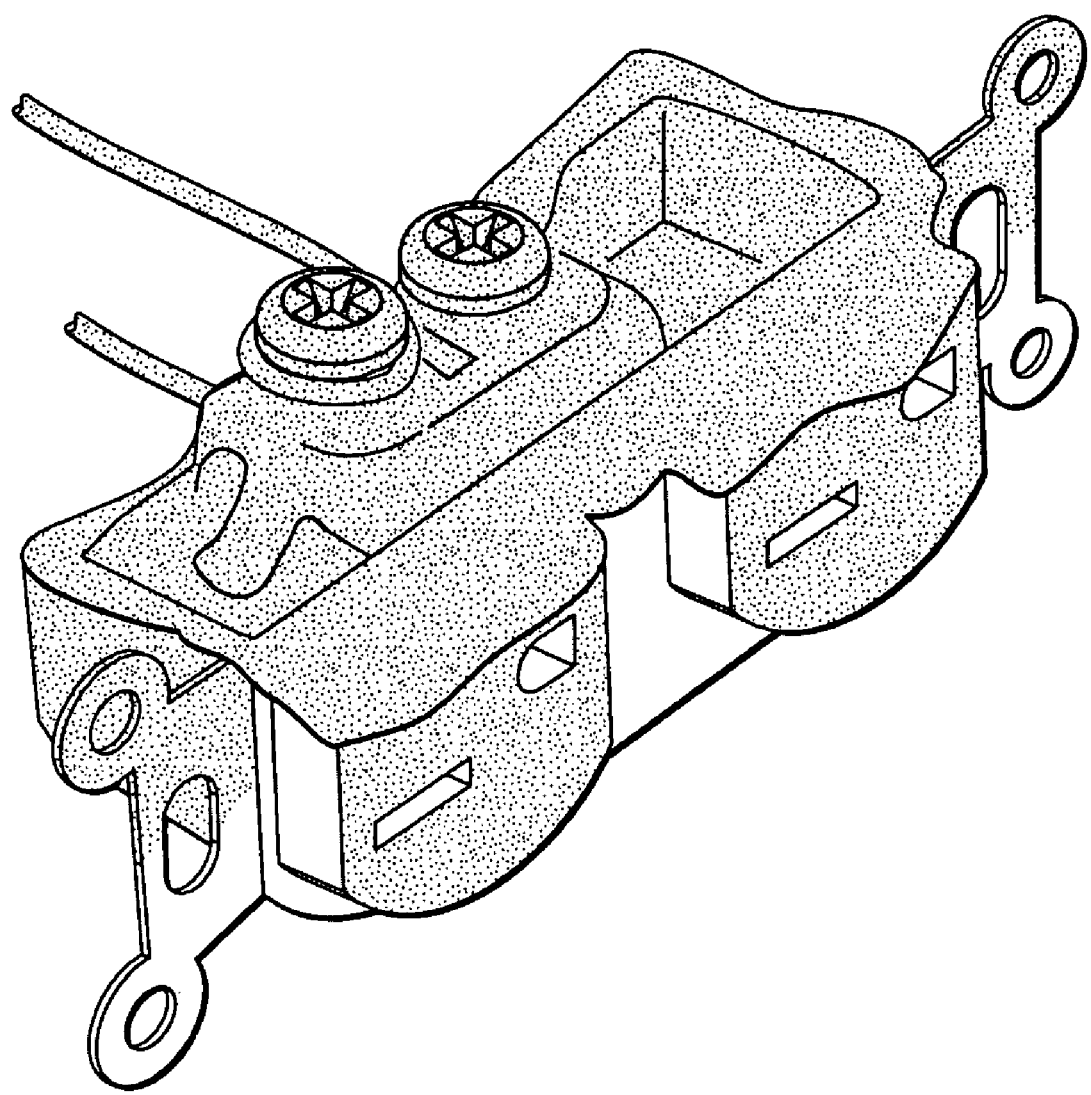
FIG. 1 shows an electrical outlet that has been damaged in a fire due to a series fault.

A description of embodiments of the present invention will now be given with reference to the Figures. It is expected that the present invention may take many other forms and shapes, hence the following disclosure is intended to be illustrative and not limiting, and the scope of the invention should be determined by reference to the appended claims.

Embodiments of the invention provide improved detection of series fault conditions, and provide improved response possibilities upon detection of such conditions. Some embodiments of the invention utilize electronic temperature sensors such as solid-state sensors and temperature sensors integrated into an integrated circuit. In some embodiments, the electronic temperature sensors are connected to a printed circuit board (PCB) that is connected to supply wire connectors, and in other embodiments they are directly connected to supply wire connectors. In some embodiments, differential temperature sensing, as an alternative to or in addition to direct temperature sensing, is provided.

The electronic temperature sensors can be quite small, and can therefore be located more closely to or directly on the supply wire connectors, which improves the rapidity with which localized heating can be detected. As the electronic sensors can be connected to PCBs and to other circuits, functionalities can be implemented using the PCBs and/or other circuits that cannot be provided with simple switching-type thermal sensors. Non-limiting examples of such additional functionality include integrated ground-fault detection, integrated safety features such as open-circuit, short-circuit, and ground fault detection, and integrated notification of detected fault conditions. Some such safety features and functionalities are described in, and embodiments of the invention may be used in conjunction with, systems, devices, and methods as described in U.S. patent application Ser. No. 11/539,171 filed Oct. 5, 2006 and naming Michael Baxter as inventor and U.S. Provisional Patent Application Ser. No. 60/724,248 filed Oct. 5, 2005 and naming Michael Baxter as inventor. Those patent applications are hereby specifically incorporated herein by reference for all they disclose.

Electronic sensors in accordance with embodiments of the present invention are capable of detecting overheating conditions at temperatures below those detected by current bimetallic temperature sensors, thereby improving the safety of electrical wiring devices and fixtures. Additionally, using electronic sensors, the threshold temperature for response can be selected or controlled to be at a variety of temperatures, including temperatures lower than those available with current bimetallic switching sensors. Detecting heating events and disconnecting power at lower temperatures improves safety. Embodiments of the invention may be incorporated into any type of wired electrical device, electrical fixture, or wiring device. Embodiments of the invention may be utilized for electrical fire hazard reduction, fire prevention, home safety, injury prevention, glowing connection detection, and series fault detection. Embodiments of the present invention may be utilized in residential, commercial, industrial, and military, among other, settings.

Embodiments of the invention can incorporate various circuit elements, including microprocessors. Some embodiments of the invention can include electronic means for communicating over-temperature conditions to a home automation or other security system that can include one or more computer devices. Therefore, as some embodiments of the invention can be used with computer-type devices and computer-related elements, a background on such devices and elements is provided. Embodiments of the invention may rely on some software elements to control device hardware, including one or more internal microprocessors.

Figure 2:
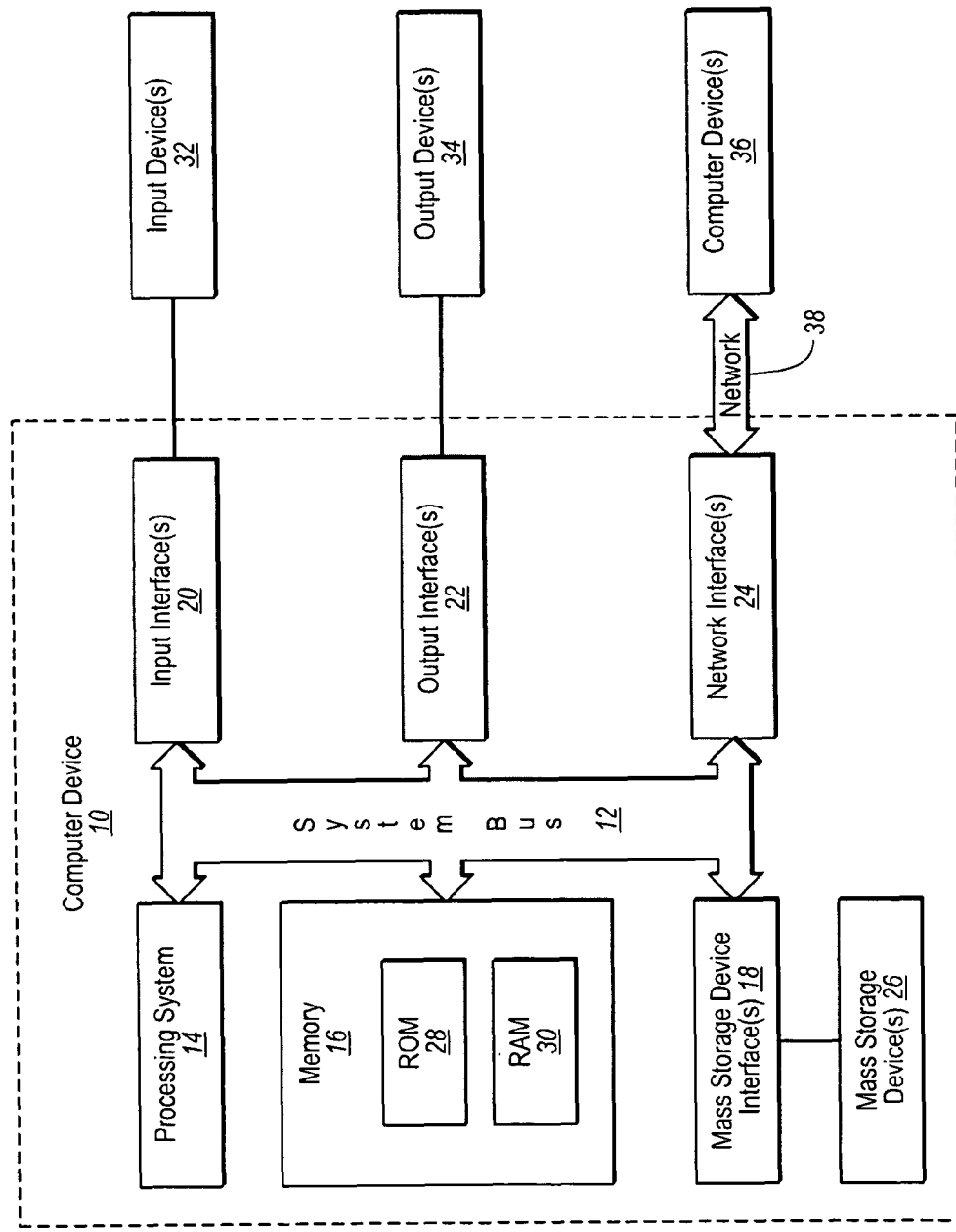
FIG. 2 shows an illustrative computer system for use with embodiments of the present invention.

FIG. 2 and the corresponding discussion are intended to provide a general description of a suitable operating environment that may be implemented in conjunction with embodiments of the invention. One skilled in the art will appreciate that embodiments of the invention may be practiced using one or more computing devices and in a variety of system configurations, including in a networked configuration. While the methods and processes of the present invention have proven to be useful in association with a system comprising a general purpose computer, embodiments of the present invention include utilization of the methods and processes in a variety of environments, including embedded systems with general purpose processing units, digital/media signal processors (DSP/MSP), application specific integrated circuits (ASIC), field programmable gate arrays (FPGA), stand alone electronic devices, and other such electronic environments.

Embodiments of the present invention embrace one or more computer readable media, wherein each medium may be configured to include or includes thereon data or computer executable instructions for manipulating data. The computer executable instructions include data structures, objects, programs, routines, or other program modules that may be accessed by a processing system, such as one associated with a general-purpose computer capable of performing various different functions or one associated with a special-purpose computer capable of performing a limited number of functions. Computer executable instructions cause the processing system to perform a particular function or group of functions and are examples of program code means for implementing steps for methods disclosed herein. Furthermore, a particular sequence of the executable instructions provides an example of corresponding acts that may be used to implement such steps. Examples of computer readable media include random-access memory ("RAM"), read-only memory ("ROM"), programmable read-only memory ("PROM"), erasable programmable read-only memory ("EPROM"), electrically erasable programmable read-only memory ("EEPROM"), compact disk read-only memory ("CD-ROM"), or any other device or component that is capable of providing data or executable instructions that may be accessed by a processing system or device.

With reference to FIG. 2, a representative system for implementation with embodiments of the invention includes computer device 10, which may be a general-purpose or special-purpose computer. For example, computer device 10 may be a personal computer, a notebook computer, a personal digital assistant ("PDA") or other hand-held device, a workstation, a minicomputer, a mainframe, a supercomputer, a multi-processor system, a network computer, a processor-based consumer electronic device, or the like.

Computer device 10 includes system bus 12, which may be configured to connect various components thereof and enables data to be exchanged between two or more components. System bus 12 may include one of a variety of bus structures including a memory bus or memory controller, a peripheral bus, or a local bus that uses any of a variety of bus architectures. Typical components connected by system bus 12 include processing system 14 and memory 16. Other components may include one or more mass storage device interfaces 18, input interfaces 20, output interfaces 22, and/or network interfaces 24, each of which will be discussed below.

Processing system 14 includes one or more processors, such as a central processor and optionally one or more other processors designed to perform a particular function or task. It is typically processing system 14 that executes the instructions provided on computer readable media, such as on memory 16, a magnetic hard disk, a removable magnetic disk, a magnetic cassette, an optical disk, or from a communication connection, which may also be viewed as a computer readable medium.

Memory 16 includes one or more computer readable media that may be configured to include or includes thereon data or instructions for manipulating data, and may be accessed by processing system 14 through system bus 12. Memory 16 may include, for example, ROM 28, used to permanently store information, and/or RAM 30, used to temporarily store information. ROM 28 may include a basic input/output system ("BIOS") having one or more routines that are used to establish communication, such as during start-up of computer device 10. RAM 30 may include one or more program modules, such as one or more operating systems, application programs, and/or program data.

One or more mass storage device interfaces 18 may be used to connect one or more mass storage devices 26 to system bus 12. The mass storage devices 26 may be incorporated into or may be peripheral to computer device 10 and allow computer device 10 to retain large amounts of data. Optionally, one or more of the mass storage devices 26 may be removable from computer device 10. Examples of mass storage devices include hard disk drives, magnetic disk drives, tape drives and optical disk drives. A mass storage device 26 may read from and/or write to a magnetic hard disk, a removable magnetic disk, a magnetic cassette, an optical disk, or another computer readable medium. Mass storage devices 26 and their corresponding computer readable media provide nonvolatile storage of data and/or executable instructions that may include one or more program modules such as an operating system, one or more application programs, other program modules, or program data. Such executable instructions are examples of program code means for implementing steps for methods disclosed herein.

One or more input interfaces 20 may be employed to enable a user to enter data and/or instructions to computer device 10 through one or more corresponding input devices 32. Examples of such input devices include a keyboard and alternate input devices, such as a mouse, trackball, light pen, stylus, or other pointing device, a microphone, a joystick, a game pad, a satellite dish, a scanner, a camcorder, a digital camera, and the like. Similarly, examples of input interfaces 20 that may be used to connect the input devices 32 to the system bus 12 include a serial port, a parallel port, a game port, a universal serial bus ("USB"), an integrated circuit, a firewire (IEEE 1394), or another interface. For example, in some embodiments input interface 20 includes an application specific integrated circuit (ASIC) that is designed for a particular application. In a further embodiment, the ASIC is embedded and connects existing circuit building blocks.

One or more output interfaces 22 may be employed to connect one or more corresponding output devices 34 to system bus 12. Examples of output devices include a monitor or display screen, a speaker, a printer, a multi-functional peripheral, and the like. A particular output device 34 may be integrated with or peripheral to computer device 10. Examples of output interfaces include a video adapter, an audio adapter, a parallel port, and the like.

One or more network interfaces 24 enable computer device 10 to exchange information with one or more other local or remote computer devices, illustrated as computer devices 36, via a network 38 that may include hardwired and/or wireless links. Examples of network interfaces include a network adapter for connection to a local area network ("LAN") or a modem, wireless link, or other adapter for connection to a wide area network ("WAN"), such as the Internet. The network interface 24 may be incorporated with or peripheral to computer device 10. In a networked system, accessible program modules or portions thereof may be stored in a remote memory storage device. Furthermore, in a networked system computer device 10 may participate in a distributed computing environment, where functions or tasks are performed by a plurality of networked computer devices.

Figure 3:
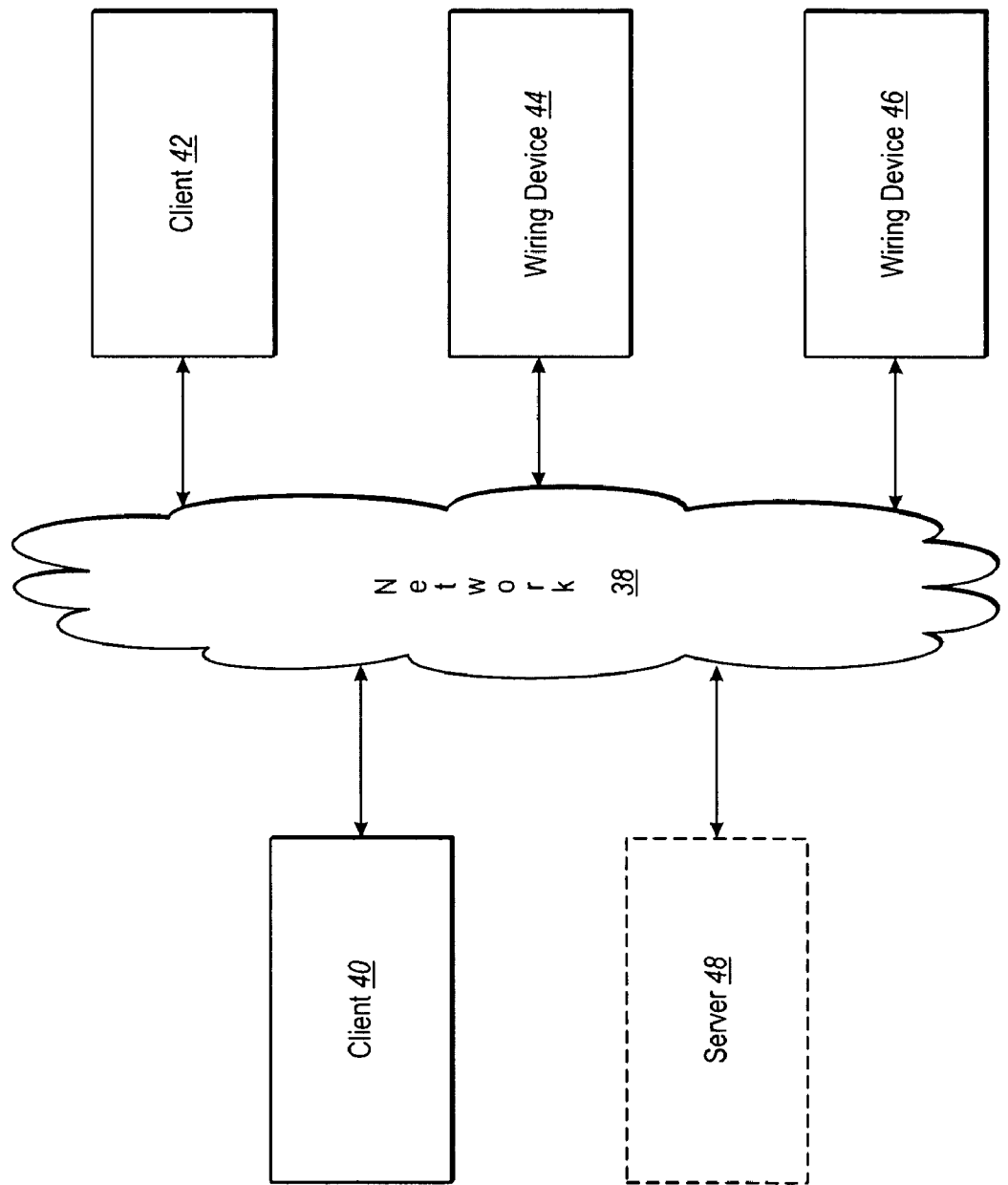
FIG. 3 shows an illustrative networked computer system for use with embodiments of the present invention.

Thus, while those skilled in the art will appreciate that embodiments of the present invention may be practiced in a variety of different environments with many types of system configurations, FIG. 3 provides a representative networked system configuration that may be used in association with embodiments of the present invention. The representative system of FIG. 3 includes a computer device, illustrated as client 40, which is connected to one or more other computer devices (illustrated as client 42) and one or more wiring devices such as outlets, switches, fans, etc. (illustrated as wiring device 44 and wiring device 46) across network 38. While FIG. 3 illustrates an embodiment that includes a client 40, a client 42 and two wiring devices, wiring device 44 and wiring device 46, and optionally a server 48, connected to network 38, alternative embodiments include more or fewer clients, more or less than two wiring devices, no server 48, and/or more than one server 48 connected to network 38. Other embodiments of the present invention include local, networked, or peer-to-peer environments where one or more computer devices may be connected to one or more local or remote peripheral devices. Moreover, embodiments in accordance with the present invention also embrace a single electronic consumer device, wireless networked environments, and/or wide area networked environments, such as the Internet.

Figure 4:
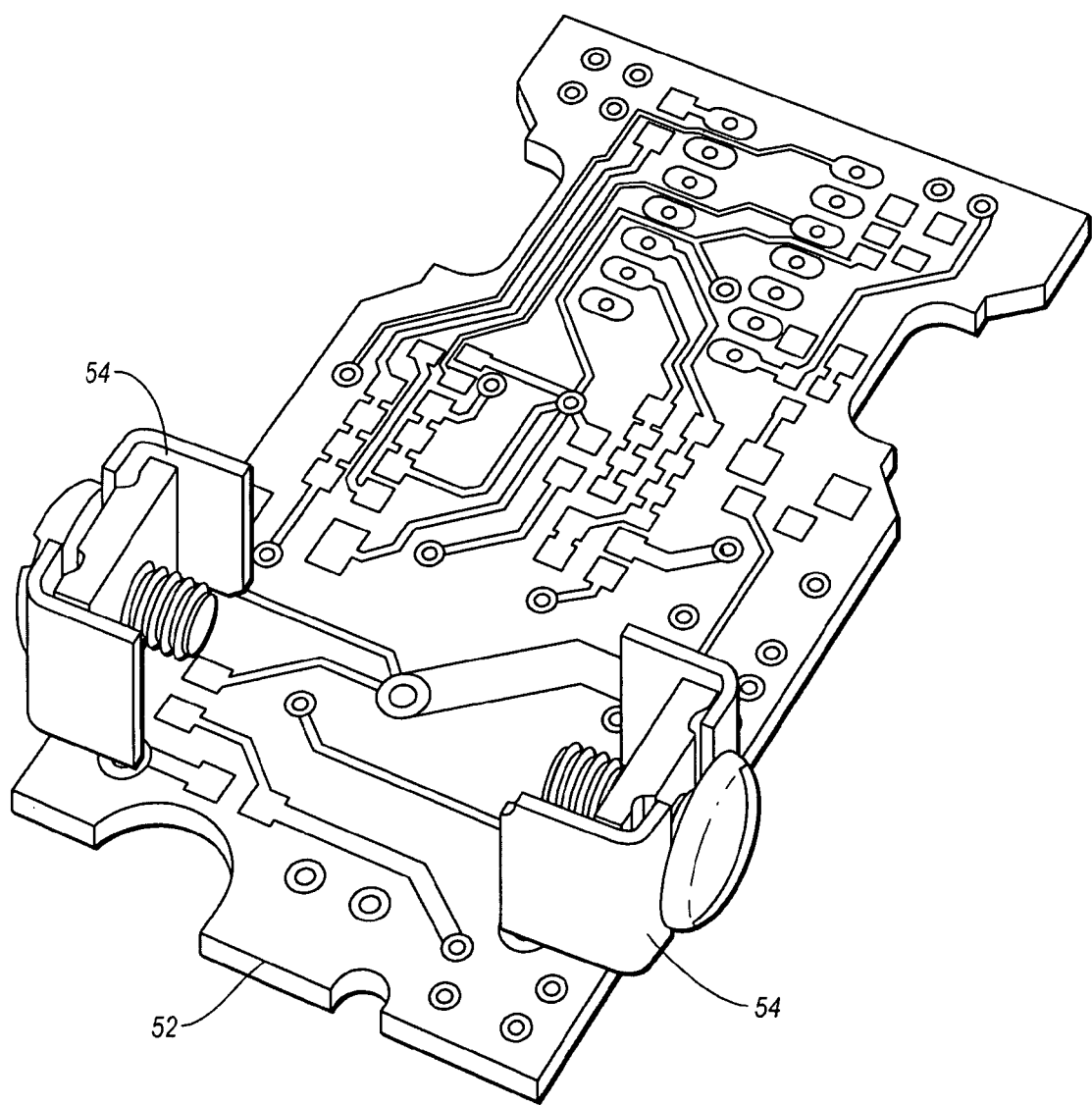
FIGS. 4 and 5 show perspective views of a representative printed circuit board having wire connection terminals.
Figure 5:
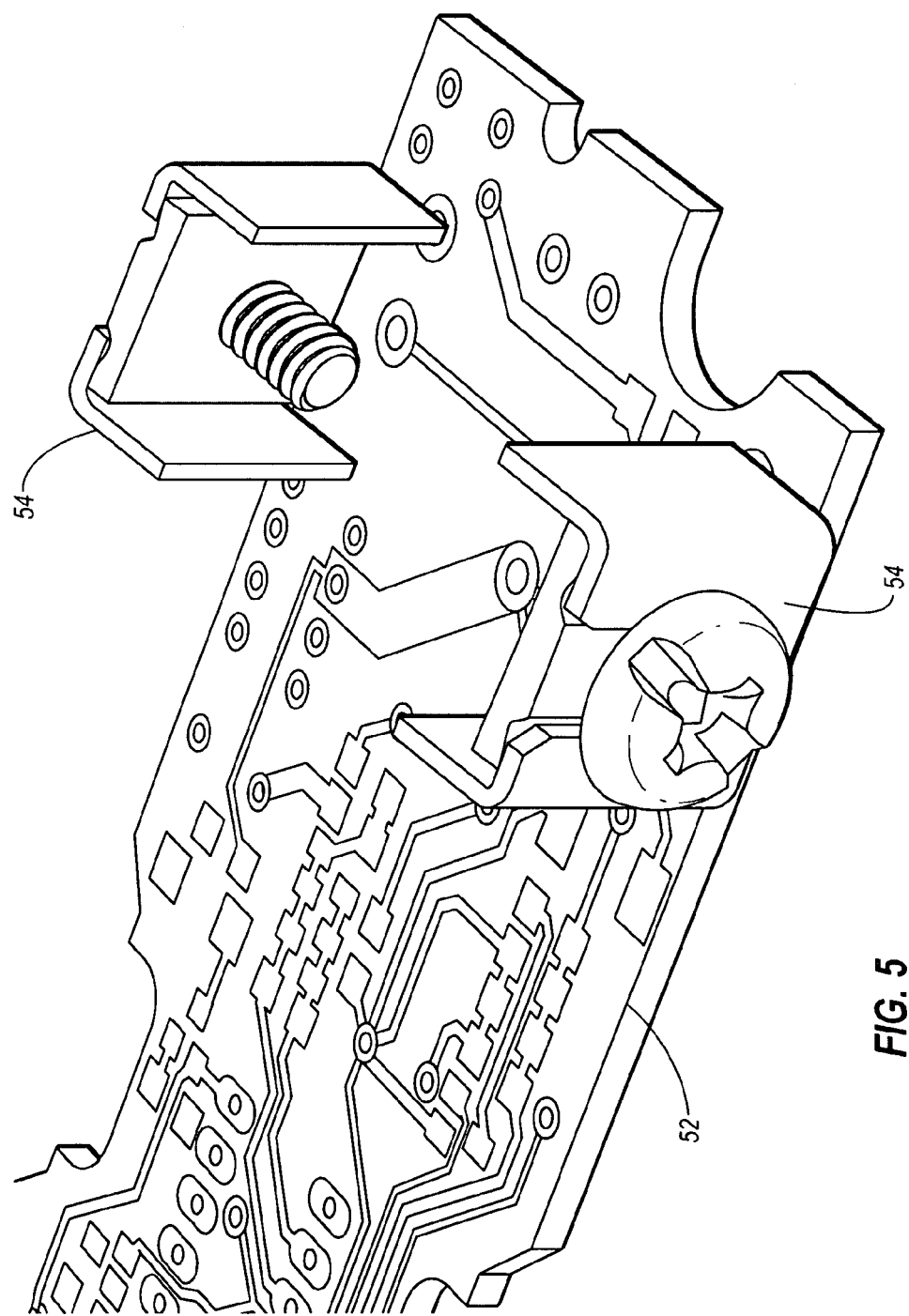

FIGS. 4-9 illustrate representative placement and embodiments of temperature sensors in accordance with embodiments of the present invention. FIGS. 4 and 5 show perspective views of a printed circuit board (PCB 52) that includes a pair of supply wire terminals 54. PCBs similar to the PCB 52 illustrated in FIGS. 4 and 5 may be included in a wide variety of wiring devices, including outlets, light switches, light fixtures, ceiling fans, appliances, etc.

Figure 6:
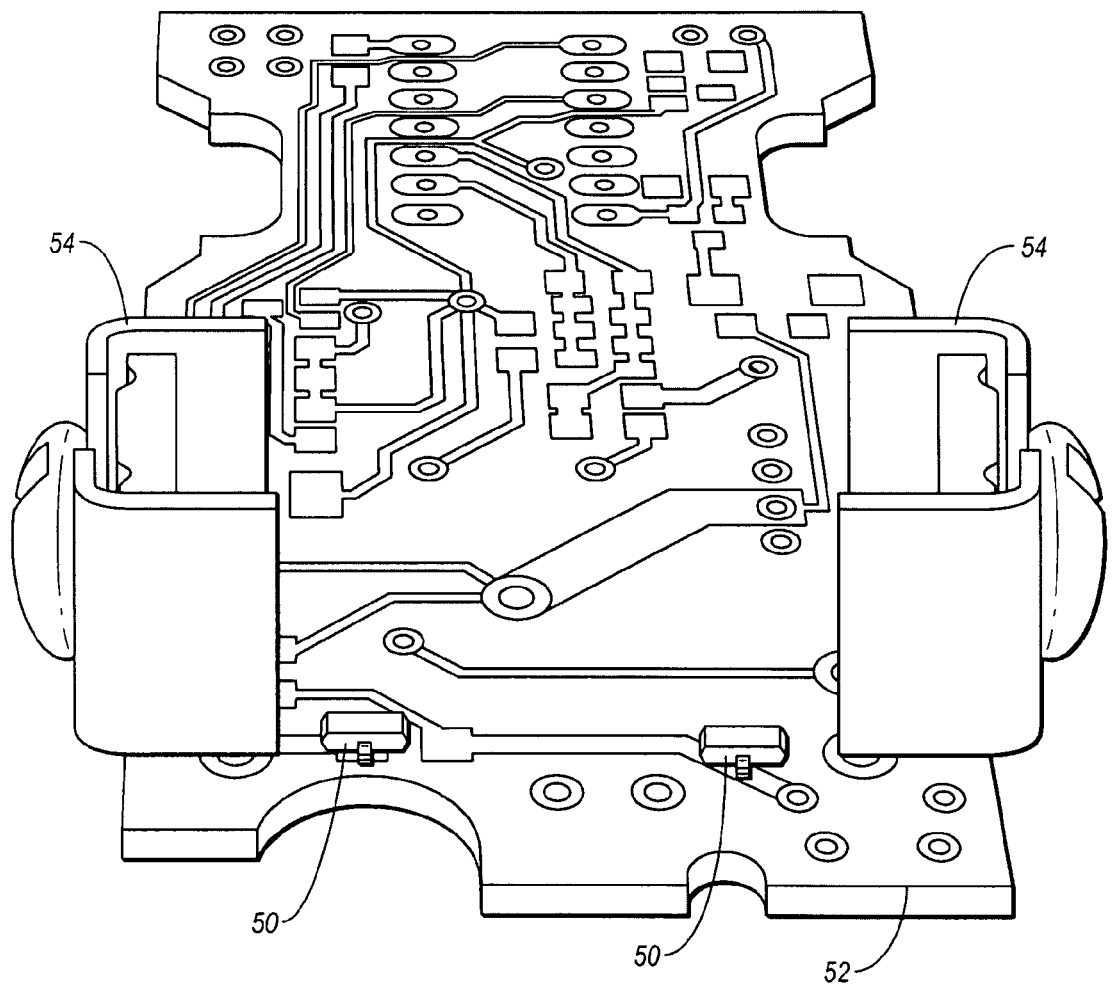
FIG. 6 shows a representative temperature sensor on a printed circuit board of a wiring device.

FIG. 6 shows a solid-state temperature sensor 50 that is soldered to the PCB 52 near a connection between the PCB 52 and the supply wire terminal 54. The supply wire terminal 54 is electrically and/or physically connected to the PCB 52. The close physical location of the temperature sensor 50 to the supply wire terminal 54 enables the temperature sensor 50 to promptly detect excessive heating. Additionally, one or more of the conductive traces of the PCB 52 may be used as a heat-conductive trace to improve the ability of the temperature sensor 50 to promptly detect over-heat conditions.

The various supply wire terminals 54 provides an attachment location for the supply wires (e.g. one or more each of hot/line, neutral, and ground, etc.), and temperature sensors 50 may be located near each supply wire terminal 54. FIG. 6 is an enlarged view of a portion of the PCB 52 of a wiring device, and therefore only two supply wire terminals 54 and sensors 50 are visible. Each supply wire terminal 54 may be of various materials, but brass and metal-coated (e.g. gold-coated) brass are common materials. In the illustrated supply wire terminal 54, a screw is provided to clamp a wire connected to the supply wire terminal 54. The temperature sensor ensures that electricity flowing through the connection does not cause excessive heating (such as due to an improperly tightened screw, an improperly located wire, or oxidation on the wire or supply wire terminal 54).

Figure 7:
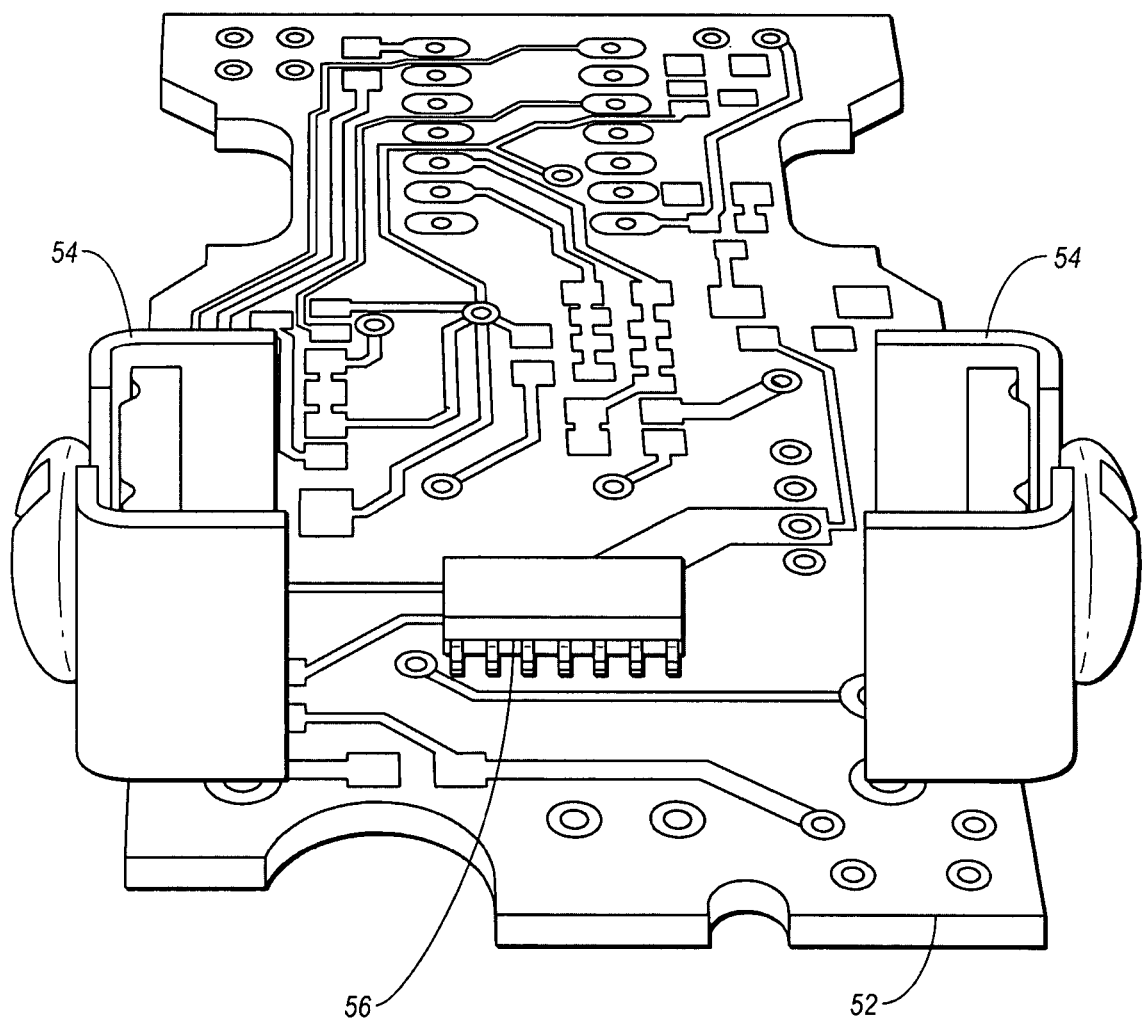
FIG. 7 shows a representative integrated circuit containing a temperature sensor on a printed circuit board of a wiring device.

FIG. 7 illustrates an alternate embodiment, where an integrated circuit 56 is provided on the PCB 52. The integrated circuit 56 includes one or more integrated temperature sensors. The chip of the integrated circuit 56 may be located at a location physically close to the supply wire terminals 54 to assist in prompt over-temperature detection. Additionally, one or more traces of the PCB 52 may be used as a heat-conductive trace, further assisting the integrated circuit 56 to promptly detect over-heating conditions.

Figure 8:
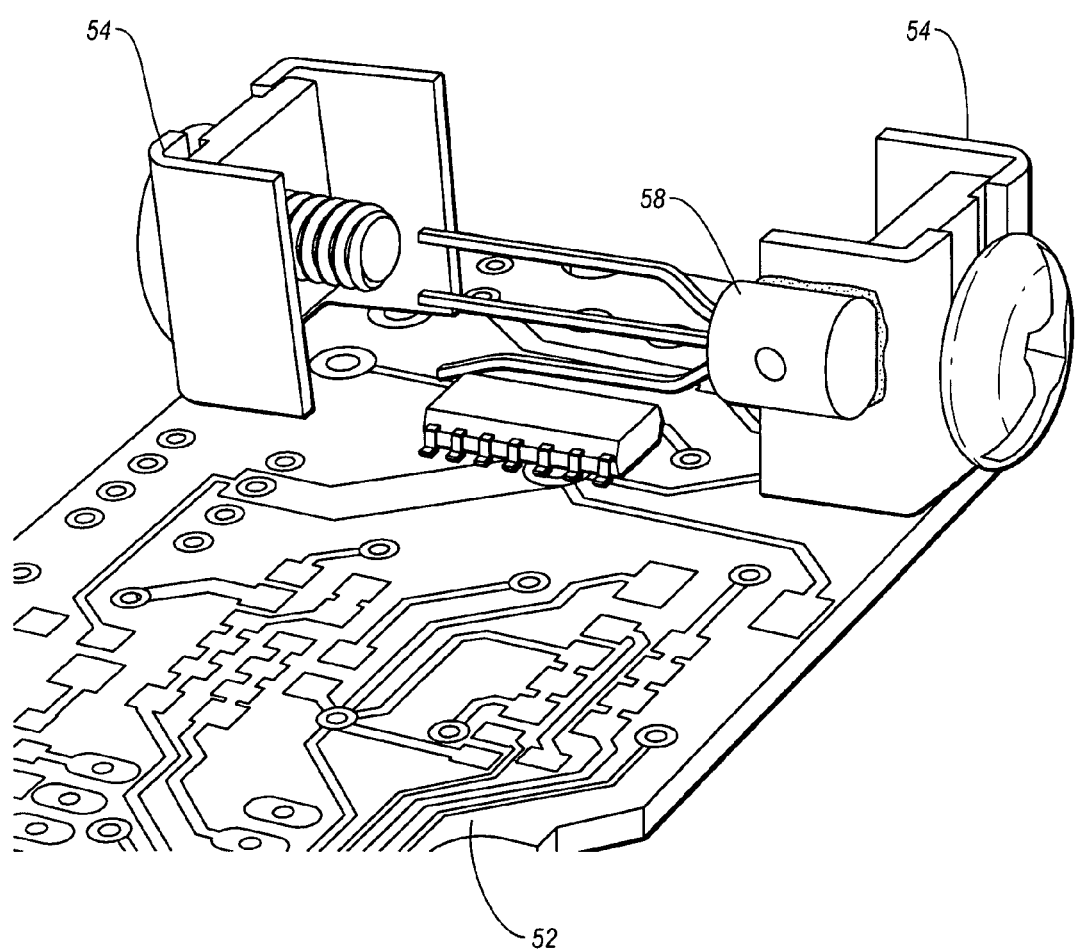
FIG. 8 shows a representative discrete temperature sensor attached to a wiring terminal of a wiring device.

FIG. 8 illustrates another alternate embodiment. In this embodiment, a discrete temperature sensor 58 is provided, and is physically attached directly to the supply wire terminal 54 or supply wire terminals 54. Although the leads of the discrete temperature sensor 58 are shown in FIG. 8 as not being electrically connected to the PCB 52, it will be understood that the discrete temperature sensor 58, in practice, is so electrically connected or is electrically connected to some other device that can provide a reaction to detected over-heat conditions. The direct physical contact between the discrete temperature sensor 58 and the supply wire terminal 54 aids in promptly detecting any unwarranted heating.

Figure 9:
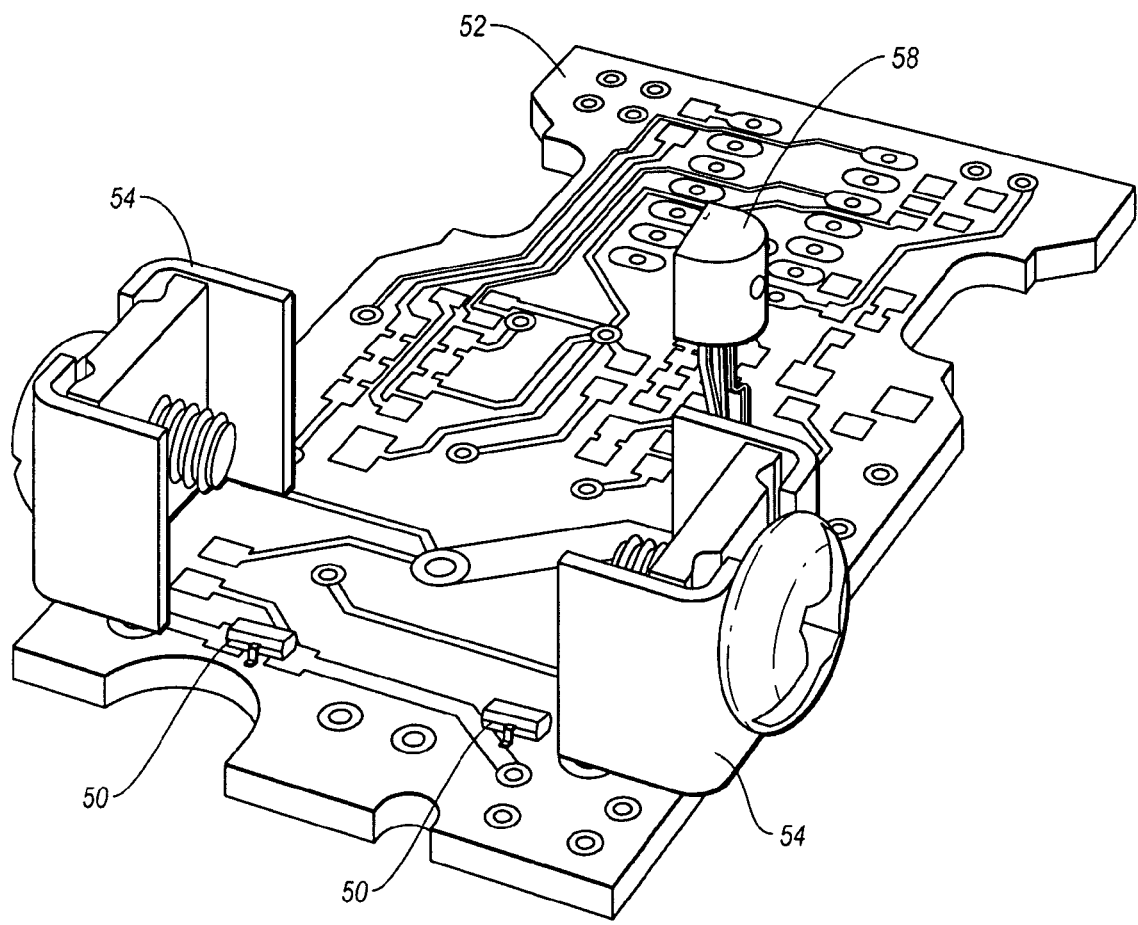
FIG. 9 shows a representative embodiment having the ability to detect temperature differentials.

Another embodiment is illustrated by FIG. 9. This embodiment utilizes a pair of temperature sensors (or more), similar to any of the sensors discussed above, to detect temperature differentials. In the embodiment illustrated in FIG. 9, one of the pair of temperature sensors is the discrete temperature sensor 58, and the other of the pair is either of the temperature sensors 50. The pair of sensors measures the temperature rise of the supply connections. One sensor measures the ambient temperature, while the second sensor or configuration of sensors measures the supply connection temperature. A circuit, either analog or digital, determines the difference between the temperature measurements.

Configurations such as this configuration may be useful, for example, in environments where the ambient temperature is relatively hot, such as temperatures approaching the temperature value that would cause a determination of an over-heat situation in a particular sensor. Another situation where this configuration may be useful is in cold climates or situations where colder temperatures of use are encountered. In such situations, sensors that detect temperature differentials can more quickly detect a fault based on a temperature differential, even if the point of localized heating has temperatures lower than would normally trigger detection of a fault with a single sensor. For example, if the ambient temperature is below freezing, but a detected temperature at a supply wire terminal 54 is, say, eighty degrees Fahrenheit, embodiments with a differential-sensing ability might determine that a fault condition exists.

Embodiments of the invention, such as those described above, solve the problems with existing devices by detecting problematic heating caused by series faults directly. Problematic heating is detected by one of various configurations of solid-state temperature sensors and the PCB 52. The PCB 52 serves various functions, including as a mounting medium for the sensors, as a mounting medium for and as a part of supporting circuitry, and as a mounting medium for the supply connectors or terminals. The solid-state sensors can be very small, allowing them to be placed near the location where heating occurs. Additionally, copper traces or other copper features of the PCB 52 are easily designed to act as thermal conduits between the supply wire connectors or terminals, which may be brass, and the sensors, assisting in reliable detection of over-temperature conditions, such as those caused by loose wires.

Embodiments of the invention improve on the interlocking mechanical systems utilizing bimetallic switching. Advantages of the embodiments of the invention include simplicity, a more direct thermal path to the thermal sensors, smaller size, and greater ease of integration with other safety systems. For example, the thermal detection systems can be integrated with ground fault circuit interruption (GFCI) circuitry, to provide increased protection against a wider variety of fault conditions. Thermal detection features as described above can also be incorporated with other safety features (in addition to GFCI or alternatively to GFCI), such as features that detect various faults, including short circuits, open circuits, and ground faults without ever supplying line voltage to the outputs of the wiring device (such as for a plug receptacle or outlet).

Thermal detection systems in accordance with embodiments of the invention can be integrated with safety features provided by the electronic nature of the thermal sensors. For example, the electronic nature of the system permits relatively easy customization of the fault response. One example of customization of the fault response is flexibility in setting the response temperature. Another example is selective programming of the response to a detected fault, such as permanent disabling of the wiring device or permitting reset of the device after a detected fault.

Still another example of customization is the activation of an audible alarm and/or visual warning lamp upon detection of a fault or near-fault condition. As discussed above, wiring connection faults lead to heat because of the current passing through the increased resistance of the faulty connection. As an example, the current passing through an outlet to a plugged-in load can be quite substantial, reaching currents over ten amps. However, the current necessary to provide power to circuitry within the outlet can be much smaller, on the order of several milliamps to tens of milliamps.

Thus, upon detection of a fault condition, the circuitry may selectively cut power to the load plugged into the outlet, but may continue to provide power to the internal circuitry of the outlet, permitting illumination of a warning light and/or activation of an audible alarm. In many instances, the few milliamps drawn through the faulty connection for such activities is insufficient to cause significant heating, and the over-heating problem detected by the outlet naturally subsides even with the warning light and/or audible alarm activated. If, however, the detected heat fails to subside within a reasonable time, the fault response can be modified to disable even the power draw necessary to provide the warning light and/or audible alarm.

In some embodiments, the circuitry included in the wiring device may be communicatively coupled to a home automation system or to an alarm system, such as by a wired or wireless connection. Such embodiments can communicate detected over-temperature conditions to the home automation system or other security system, which may result in an appropriate response, including summoning of the fire department or other assistance.

Embodiments of the invention may be incorporated into a wide range of systems, devices, wiring devices, and appliances. Non-limiting examples include AC wall switches, AC simplex and duplex receptacles, light fixtures, extension cords, appliance plug-ends, stand-alone modules placed in a junction box, etc.

The present invention may be embodied in other specific forms without departing from its spirit or essential characteristics. The described embodiments are to be considered in all respects only as illustrative and not restrictive. The scope of the invention is, therefore, indicated by the appended claims, rather than by the foregoing description. All changes which come within the meaning and range of equivalency of the claims are to be embraced within their scope.

What is claimed and desired to be secured by Letters Patent is:

1. A system for reducing electrically-caused fires in wiring devices comprising:
   a wiring device having a terminal for attaching a wire;
   a first electronic temperature sensor in close proximity to the terminal;
   a second electronic temperature sensor;
   circuitry electrically connected to the first and second temperature sensors, the circuitry being configured to receive temperature information from the first and second temperature sensors and to interrupt power to the wiring device without interrupting power to the circuitry when a reference temperature is exceeded at the temperature sensor and wherein the circuitry is further configured to detect a temperature differential between the first temperature sensor and the second temperature sensor and to interrupt power to the wiring device when the temperature differential exceeds a reference temperature differential, the circuitry further comprising additional safety circuitry for the wiring device, the additional safety circuitry selected from the group of:
      a circuit configured to detect a short circuit at the wiring device before supplying line voltage to the wiring device and to not deliver line voltage to the wiring device if a short circuit is detected;
      a circuit configured to detect a presence of a load at the wiring device before supplying line voltage to the wiring device and to not deliver line voltage to the wiring device if no load is detected;
      a circuit configured to detect an open circuit at the wiring device before supplying line voltage to the wiring device and to not deliver line voltage to the wiring device if an open circuit is detected;
      a circuit configured to detect a ground fault at the wiring device before supplying line voltage to the wiring device and to not deliver line voltage to the wiring device if a ground fault is detected;
      a circuit configured to detect a short circuit in the wiring device after line voltage is delivered to the wiring device and to interrupt power to the wiring device upon detection of a short circuit; and
      a circuit configured to detect an open circuit in the wiring device after line voltage is delivered to the wiring device and to interrupt power to the wiring device upon detection of an open circuit; and
      one of:
         an audible alarm activated by the circuitry upon detection of the thermal event and interruption of power to the wiring device; and
         a visible alarm activated by the circuitry upon detection of the thermal event and interruption of power to the wiring device.

2. A system as recited in claim 1, wherein the temperature sensor is a solid-state device.

3. A system as recited in claim 1, further comprising a printed circuit board, wherein the terminal and the temperature sensor are connected to the printed circuit board.

4. A system as recited in claim 3, wherein the temperature sensor is thermally connected to the terminal by a trace of the printed circuit board.

5. A system as recited in claim 3, wherein the temperature sensor comprises a portion of an integrated circuit on the printed circuit board.

6. A system as recited in claim 1, wherein the temperature sensor comprises a portion of an integrated circuit chip.

7. A system as recited in claim 1, wherein the temperature sensor is a discrete temperature sensor that is physically attached to the terminal.

8. A system as recited in claim 1, wherein the temperature sensor is a first temperature sensor and the terminal is a first terminal, the system further comprising:
   a second terminal for attaching a wire; and
   a second electronic temperature sensor in close proximity to the second terminal, wherein the circuitry is also electrically connected to the second temperature sensor and is configured to receive information from the second temperature sensor and to interrupt power to the wiring device when the reference temperature is exceeded at the second temperature sensor.

9. A system as recited in claim 1, wherein the wiring device comprises one of:
   an outlet;
   a light switch;
   a light fixture;
   an appliance;
   an extension cord; and
   a circuit breaker.

10. A system as recited in claim 1, wherein the second temperature sensor is located in close proximity to another terminal of the wiring device.

11. A system as recited in claim 1, wherein the system is a wiring device system that is communicatively coupled with an external system that acts on notifications received from the wiring device system regarding detected thermal events, the external system being selected from the group of:
   a building automation system;
   a building fire detection and notification system;
   a local security system; and
   an externally-monitored security system.

12. A system as recited in claim 11, wherein the communicative coupling between the wiring device system and the external system comprises one of:
   a hard-wired communicative connection; and
   a wireless communicative connection.

13. A system as recited in claim 1, wherein upon detection of a thermal event and interruption of power to the wiring device, the system can be reset and power restored to the wiring device.

14. A system for monitoring over-temperature conditions in a wiring device, the system comprising:
   a wiring device having a terminal for attaching an electrical supply wire to the wiring device;

a printed circuit board physically connected to the terminal;

a first solid-state temperature sensor electrically connected to the printed circuit board in close proximity to the terminal;

a second solid-state temperature sensor electrically connected to the printed circuit board;

a safety circuit configured to receive temperature information from the first and second solid-state temperature sensors and to interrupt power to the wiring device upon detection of an over-temperature event indicative of a series fault between the terminal and the electrical supply wire and further configured to detect a temperature differential between the first solid-state temperature sensor and the second solid-state temperature sensor and to interrupt power to the wiring device when the temperature differential exceeds a reference temperature differential, all without interrupting power to the safety circuit;

additional safety circuitry for the wiring device, the additional safety circuitry selected from the group of:

a circuit configured to detect a short circuit at the wiring device before supplying line voltage to the wiring device and to not deliver line voltage to the wiring device if a short circuit is detected;

a circuit configured to detect a presence of a load at the wiring device before supplying line voltage to the wiring device and to not deliver line voltage to the wiring device if no load is detected;

a circuit configured to detect an open circuit at the wiring device before supplying line voltage to the wiring device and to not deliver line voltage to the wiring device if an open circuit is detected;

a circuit configured to detect a ground fault at the wiring device before supplying line voltage to the wiring device and to not deliver line voltage to the wiring device if a ground fault is detected;

a circuit configured to detect a short circuit in the wiring device after line voltage is delivered to the wiring device and to interrupt power to the wiring device upon detection of a short circuit; and a circuit configured to detect an open circuit at the wiring device after line voltage is delivered to the wiring device and to interrupt power to the wiring device upon detection of an open circuit; and one of:

an audible alarm activated by the safety circuit upon detection of the thermal event and interruption of power to the wiring device; and a visible alarm activated by the safety circuit upon detection of the thermal event and interruption of power to the wiring device.

15. A system as recited in claim 14, wherein the temperature sensor is thermally connected to the terminal by a trace of the printed circuit board.

16. A system as recited in claim 14, wherein the temperature sensor comprises a portion of an integrated circuit on the printed circuit board.

17. A system for detecting series faults in a wiring device, the system comprising:

a wiring device having a plurality of terminals for attaching electrical supply wires to the wiring device;

a printed circuit board physically and electrically connected to the terminals;

a plurality of solid-state temperature sensors electrically connected to the printed circuit board in close physical proximity to the terminals;

a safety circuit configured to receive temperature information from the temperature sensors and to interrupt power to the wiring device upon detection of an over-temperature event indicative of a series fault between one of the terminals and one of the electrical supply wires and further configured to detect a temperature differential between the temperature sensors and to interrupt power to the wiring device when the temperature differential exceeds a reference temperature differential, all without interrupting power to the safety circuit;

additional safety circuitry for the wiring device, the additional safety circuitry selected from the group of:

a circuit configured to detect a short circuit at the wiring device before supplying line voltage to the wiring device and to not deliver line voltage to the wiring device if a short circuit is detected;

a circuit configured to detect a presence of a load at the wiring device before supplying line voltage to the wiring device and to not deliver line voltage to the wiring device if no load is detected;

a circuit configured to detect an open circuit at the wiring device before supplying line voltage to the wiring device and to not deliver line voltage to the wiring device if an open circuit is detected;

a circuit configured to detect a ground fault at the wiring device before supplying line voltage to the wiring device and to not deliver line voltage to the wiring device if a ground fault is detected;

a circuit configured to detect a short circuit in the wiring device after line voltage is delivered to the wiring device and to interrupt power to the wiring device upon detection of a short circuit; and a circuit configured to detect an open circuit at the wiring device after line voltage is delivered to the wiring device and to interrupt power to the wiring device upon detection of an open circuit; and one of:

an audible alarm activated by the safety circuit upon detection of the thermal event and interruption of power to the wiring device; and a visible alarm activated by the safety circuit upon detection of the thermal event and interruption of power to the wiring device.

18. A system as recited in claim 17, wherein at least one temperature sensor is thermally connected to at least one terminal by a trace of the printed circuit board.

* * * * *